United States Patent
Ogino et al.

[11] Patent Number: 6,091,475
[45] Date of Patent: Jul. 18, 2000

[54] CONNECTOR FOR DISPLAY INSPECTION OF A LIQUID CRYSTAL DISPLAY PANEL AND METHOD FOR THE PREPARATION THEREOF

[75] Inventors: Tsutomu Ogino, Nagano-ken; Hiroto Komatsu, Saitama-ken, both of Japan

[73] Assignee: Shin-Etsu Polymer Co., Ltd., Tokyo, Japan

[21] Appl. No.: 08/987,359

[22] Filed: Dec. 9, 1997

[30] Foreign Application Priority Data

Dec. 19, 1996 [JP] Japan ................................. 8-339962

[51] Int. Cl.⁷ .................... G02F 1/1345; H01L 23/48; H01R 9/09; H01R 4/58
[52] U.S. Cl. .................... 349/149; 349/151; 349/152; 257/693; 439/62; 439/79; 439/86
[58] Field of Search .................... 349/149, 150, 349/151, 152; 257/693, 778; 439/62, 79, 86

[56] References Cited

U.S. PATENT DOCUMENTS

| | | | |
|---|---|---|---|
| 5,161,009 | 11/1992 | Tanoi et al. | 257/693 |
| 5,429,510 | 7/1995 | Barraclough et al. | 439/79 |
| 5,528,403 | 6/1996 | Kawaguchi et al. | 349/149 |
| 5,717,476 | 2/1998 | Kanezawa | 349/149 |
| 5,729,316 | 3/1998 | Yamamura et al. | 349/150 |
| 5,738,530 | 4/1998 | Schreiber et al. | 439/86 |
| 5,760,862 | 6/1998 | Bachus | 349/149 |
| 5,777,705 | 7/1998 | Pierson et al. | 349/149 |
| 5,818,561 | 10/1998 | Nakanishi | 349/149 |
| 5,822,030 | 10/1998 | Uchiyama | 349/149 |
| 5,847,796 | 12/1998 | Uchiyama et al. | 349/151 |
| 5,860,815 | 6/1999 | Feldman et al. | 439/79 |
| 5,898,218 | 4/1999 | Hirose et al. | 257/693 |

*Primary Examiner*—William L. Sikes
*Assistant Examiner*—Tarifur R. Chowdhury
*Attorney, Agent, or Firm*—McAulay Nissen Goldberg Kiel & Hand, LLP

[57] ABSTRACT

Proposed is a novel connector for display inspection of a liquid crystal display panel, by which the display panel per se can be inspected before mounting of a driver IC chip thereon to greatly improve the productivity of the display inspection. The inventive display inspection connector comprises:

(a) a circuit board having input electrode terminals and output electrode terminals provided on one surface;
(b) connecting lead wires each connected at one end to one of the output electrode terminals taking an arch-wise bent configuration, the other end being extended to the opposite side of the circuit board;
(c) a rigid covering body having a downwardly extended side portion and fixed to the circuit board to cover the connecting lead wires within the space below the covering body, a cavity or groove being formed in the downwardly facing end surface of the downwardly extended side portion;
(d) an insulating cured rubber filling the space below the covering body to embed the connecting lead wires therein excepting the end portions thereof not connected to the output electrode terminals to be exposed; and
(e) a driver IC chip adhesively bonded to the bottom surface of the cavity or groove formed in the downwardly facing end surface of the side portion of the covering body with intervention of an insulating elastomer sheet.

2 Claims, 3 Drawing Sheets

CONNECTOR FOR DISPLAY INSPECTION OF A LIQUID CRYSTAL DISPLAY PANEL AND METHOD FOR THE PREPARATION THEREOF

BACKGROUND OF THE INVENTION

The present invention relates to a connector for display inspection of a liquid crystal display panel or, more particularly, to a connector suitable for display inspection of a liquid crystal display panel having a driver IC (integrated circuit) chip directly mounted on a glass substrate for the liquid crystal display panel by the so-called COG (chip-on-glass) mounting as well as a method for the preparation thereof.

While it is the prior art technology that driver ICs of a liquid crystal display panel are mounted on the glass substrate by the so-called TAB (tape-automated bonding) mounting as an industrial mounting method, it is a trend in recent years that the method of COG mounting is widely applied to liquid crystal display panels in order to comply with the increasing requirements in various kinds of extremely compact information-processing instruments for still more compactness with a decrease in the thickness and weight, higher precision and resolution and decreased production costs in view of the advantages of the COG mounting method that the production cost can be decreased due to saving of the materials and simplification of the assembling process and a possibility is obtained for a design of a finer pitch.

The display inspection of a liquid crystal display panel, referred to as a display panel hereinafter, by the COG mounting is conducted conventionally in the following manner. Thus, as is illustrated in FIG. 1 by a vertical cross sectional view, the glass substrate 31 is first inspected for the electric circuit, then a driver IC chip 32 is mounted on the glass substrate 31 with intervention of an anisotropically electroconductive film 33 therebetween by the COG mounting method, the electrode terminals 34, 34' of the driver IC chip 32 are connected to the delivery electrodes 35 for display input signals and the delivery electrodes 36 for display output signals, respectively, and the delivery electrodes 35 for display input signals are connected to the electrodes 38 of the FPC (flexible printed circuit) board 37 with intervention of an anisotropically electroconductive film 33' to establish a mounting condition simulating an actual product to which signals are supplied to effect the final display inspection of the display panel 39.

Since it is a usual way of mounting that driver IC chips are mounted in a condition before inspection by a burn-in test, discrimination is sometimes difficult for exact location of the origin of the disorder or failure of a display panel detected by the above mentioned display inspection which may be either in the driver IC chip or in the display panel. This way of display inspection necessarily leads to a very low productivity of the assembling work which is conducted by replacing the parts of suspected failure such as the driver IC chip and FPC with respective spare parts resulting in disadvantages of a decreased yield of acceptable products and an increased cost for production.

SUMMARY OF THE INVENTION

The present invention accordingly has an object, in view of the above described problems and disadvantages, to provide a novel connector for display inspection of display panels, by the use of which a display panel can be inspected in a condition corresponding to the actual mounting so as to improve the assemblage yield of the display panels as well as a method for the preparation thereof.

Thus, the present invention provides a connector for display inspection of a liquid crystal display panel which comprises, as an assembly:

(a) a circuit board having input electrode terminals and output electrode terminals provided on one surface of the circuit board and electrically connected together;

(b) connecting lead wires each connected at one end to one of the output electrode terminals of the circuit board taking an arch-wise bent configuration, the other end extending to the opposite side of the circuit board relative to the output electrode terminals;

(c) a rigid covering body having a downwardly extended side portion and fixed to the circuit board to cover the connecting lead wires as a whole within the space between the circuit board and the covering body, a cavity or groove being formed in the downwardly facing end surface of the downwardly extended side portion;

(d) an insulating cured elastomeric resin filling the space below the covering body to embed the connecting lead wires therein excepting the end portions of the connecting lead wires not connected to the output electrode terminals to be exposed; and (e) a driver IC chip having electrode terminals in substantially the same wiring pattern and arrangement pitch as the delivery electrodes for display output signals in the glass substrate of the liquid crystal display panel to be inspected and adhesively bonded to the bottom surface of a cavity or groove formed in the downwardly facing end surface of the side portion of the covering body with intervention of an insulating elastomer sheet in such a fashion that, when the driver IC chip is brought to a position corresponding to the mounting position on the glass substrate, the exposed end portions of the connecting lead wires are on the display input signal delivery electrodes and the exposed end portions of the connecting lead wires and the electrode terminals of the driver IC chip are on the same plane.

The above defined connector for display inspection of a liquid crystal display panel can be prepared by a process which comprises the steps of:

(1a) forming an integral assembly of a bonding base plate and a circuit board having input electrode terminals and output electrode terminals on the same surface;

(1b) connecting each of the output electrode terminals of the circuit board and the bonding base plate with a connecting lead wire by wire bonding;

(2a) mounting and fixing onto the circuit board a rigid covering body having a downwardly extended side portion and provided with an injection port for injection of a liquid resin and a cavity or groove for insertion of a driver IC chip in the lower end surface of the downwardly extended side portion to bridge the circuit board and the bonding base plate in such a fashion that the connecting lead wires are enveloped in the space below the covering body;

(2b) filling the space below the covering body by injecting a curable insulating liquid elastomer resin through the injection port and curing the curable resin into an elastomer body so as to encapsulate the connecting lead wires as a whole;

(3) removing the bonding base plate from the circuit board by etching so as to expose the end portions of the connecting lead wires out of the cured elastomer body;

(4) forming a corrosion-resistant plating layer of a metal on the exposed ends of the connecting lead wires; and (5) adhesively bonding a driver IC chip onto the bottom surface of the cavity or groove in the covering body with intervention of an insulating elastomer sheet.

DETAILED DESCRIPTION OF THE PREFERRED EMBODIMENTS

Figure 1:
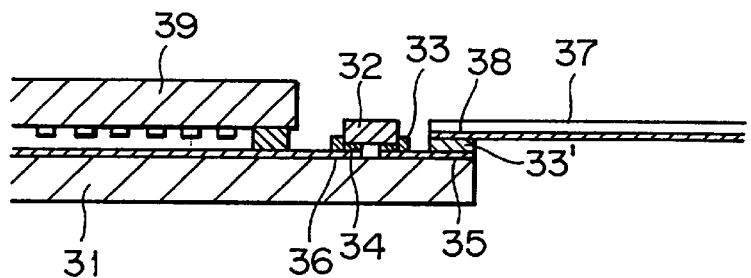
FIG. 1 is an illustration of an assembly for display inspection of a liquid crystal display panel using a conventional connector for display inspection in COG mounting by a vertical cross sectional view.
Figure 2A:
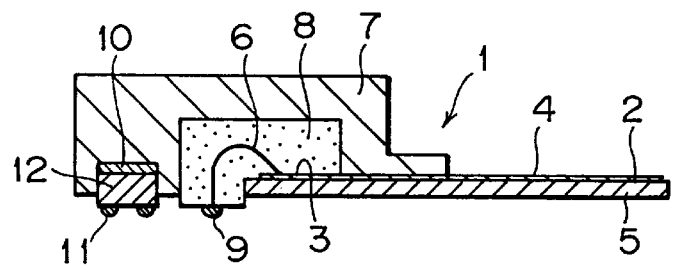
FIGS. 2A and 2B are a vertical cross sectional view and a schematic plan view, respectively, of the inventive connector for display inspection.
Figure 2B:
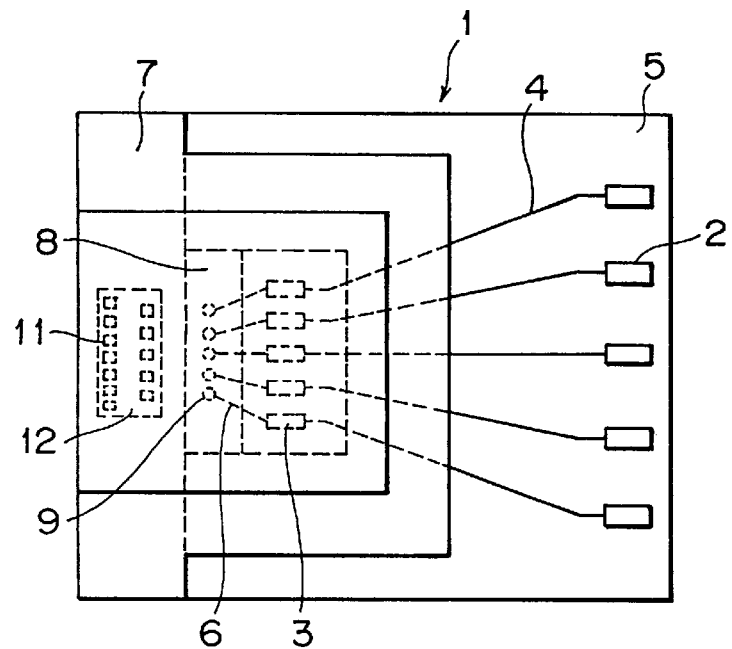

As is described above, the connector for display inspection provided by the present invention is an integral assembly which comprises, making reference to FIGS. 2A and 2B illustrating the connector by a vertical cross sectional view and a schematic plan view, respectively:

(a) a circuit board 5 having input electrode terminals 2 and output electrode terminals 3 on the same surface as electrically connected by a patterned wiring 4;

(b) connecting lead wires 6 each connected at one end to one of the output electrode terminals 3 of the circuit board 5 in such a fashion as to be extended at the other end in the form of an arch to the opposite side of the circuit board 5 relative to the output electrode terminals 3;

(c) a rigid covering body 7 having a downwardly extended side portion and provided with a cavity or groove in the lower end surface of the downwardly extended side portion and fixed to the circuit board 5 to cover the connecting lead wires 6 as a whole within the space between the circuit board 5 and the covering body 7;

(d) an insulating elastomer body 8 filling the space below the covering body 7 to embed the connecting lead wires 6 therein excepting the end portions 9 of the connecting lead wires 6 not connected to the output electrode terminals 3 to be exposed; and (e) a driver IC chip 12 having electrode terminals 11 in substantially the same wiring pattern and arrangement pitch as the delivery electrodes for display output signals in the glass substrate of the liquid crystal display panel to be inspected and adhesively bonded onto the bottom surface of the cavity or groove formed in the lower end surface of the downwardly extended side portion of the covering body 7 with intervention of an insulating elastomer sheet 10 in such a fashion that, when the driver IC chip 12 is brought to a position corresponding to the mounting position on the glass substrate, the exposed end portions 9 of the connecting lead wires 6 are on the display input signal delivery electrodes and the exposed end portions 9 of the connecting lead wires 6 and the electrode terminals 11 of the driver IC chip 12 are on the same plane.

The above described connector of the invention for display inspection can be prepared in the process described below by making reference to FIGS. 4A to 4E each for illustration of one of the steps.

Figure 4A:
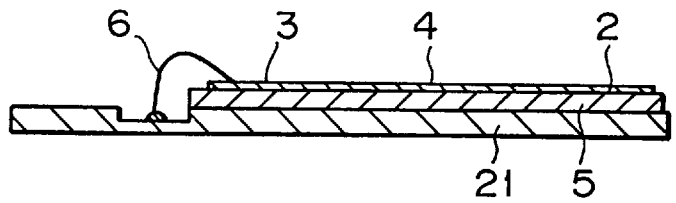
FIGS. 4A to 4E are each an illustration of one of the steps of the process for the preparation of an inventive connector for display inspection by a vertical cross sectional view.

As is illustrated in FIG. 4A, a circuit board 5 having input electrode terminals 2 and output electrode terminals 3 connected together with a wiring pattern 4 is mounted on and integrally bonded to a bonding base plate 21 having a larger dimension than the circuit board 5, in exact positioning (step (1a) ). Each of the output electrode terminals 3 is connected to the bonding base plate by wire bonding by means of a connecting lead wire 6 taking an arch-wise bent configuration bridging the circuit board 5 and the bonding base plate 21 (step (1b)).

The material of the circuit board 5 is not particularly limitative including various kinds of electrically insulating materials such as glass fiber-reinforced resins, e.g., epoxy resins and BT resins, ceramics, multilayered plates and FPC as well as lead frames, of which glass fiber-reinforced epoxy resin plates are preferred as the material of the circuit board 5 due to economical reasons.

The metallic material of the connecting lead wires 6 is not particularly limitative including fine filaments of gold, gold-based alloys, copper, aluminum, aluminum-silicon alloys, beryllium copper, brass, nickel molybdenum, tungsten and stainless steels, if desired,plated with gold or a gold-based alloy, of which gold filaments are preferred, The diameter of the connecting lead wires 6 is selected in consideration of the arrangement pitch of the electrode terminals on the liquid crystal display panels under inspection and other factors but is usually in the range from 18 to 50 $\mu$m or, preferably, from 20 to 30 $\mu$m.

Figure 4B:
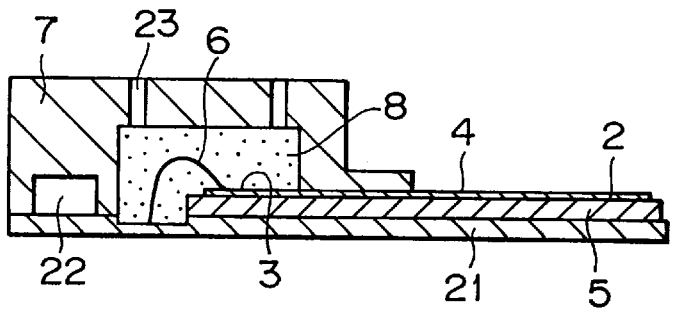

In the next step, as is illustrated in FIG. 4B, a rigid covering body 7 having an injection port 23 penetrating the upper wall thereof and a cavity or groove 22 on the lower end surface of the downwardly extending side portion thereof is mounted on and fixed to the circuit board 5 in such a fashion of bridging the circuit board 5 and the bonding base plate 21 (step (2a) ). The connecting lead wires 6 are as a whole covered by and enveloped in the space below the covering body 7. Thereafter, the above mentioned void space below the covering body 7 is completely filled with a curable insulating liquid elastomer resin 8 injected thereinto through the injection port 23 in the upper wall of the covering body 7 so that the connecting lead wires 6 are completely embedded in the liquid curable resin 8, which is then subjected to curing, if necessary, by heating to encapsulate the connecting lead wires 6 as a whole (step (2b)).

The material of the covering body 7 can be selected from various kinds of rigid materials including plastic resins, ceramic materials and metallic materials, of which metallic materials are preferred due to their high dimensional accuracy and mechanical strengths.

Various kinds of curable liquid elastomer compositions can be used to fill the space below the covering body 7 including silicone rubbers, polybutadiene rubbers, natural rubber, polyisoprene rubbers, urethane rubbers, chloroprene rubbers and styrene-butadiene copolymeric rubbers as well as foamed porous bodies of these rubber materials. It is optional that the rubber material is admixed with an internal priming agent with an object to improve the adhesive bonding between the cured rubbery body 8 and the connecting lead wires 6 embedded therein. It is important to select a rubbery material having adequate elasticity and hardness to facilitate conforming deformation with bending of the connecting lead wires 6 so that a good contacting condition can always be ensured between contact points.

The above mentioned liquid elastomer resin injected into the space below the covering body 7 has a viscosity in the range from 5 to 1000 poise or, preferably, from 10 to 500 poise. When the viscosity of the liquid resin is too high, a trouble would be caused due to undesired deformation or displacement of the connecting lead wires 6 each forming an arch, if not to mention the difficulty in completely filling the space below the covering body 7, while, when the viscosity of the liquid resin is too low, a trouble would eventually be caused due to leakage of the liquid resin out of the space below the covering body 7. It is also important to select the liquid resin from those exhibiting as small as possible shrinkage upon curing and those curable at an as low as possible temperature or, desirably, at room temperature in order to ensure high positioning accuracy of the connecting lead wires 6.

Figure 4C:
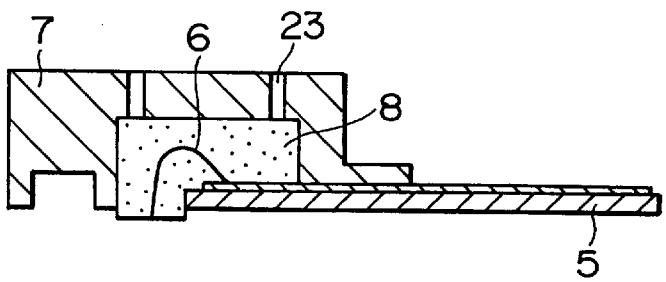

In the following step, as is illustrated in FIG. 4C, the bonding base plate 21 is removed from the circuit board 5 by a suitable means depending on the material thereof such as chemical etching using an etching solution so as to expose the end portion of each of the connecting lead wires 6, which has been bonded in the preceding steps to the bonding base plate 21, out of the cured elastomer body 8 (step (3) ).

Figure 4D:
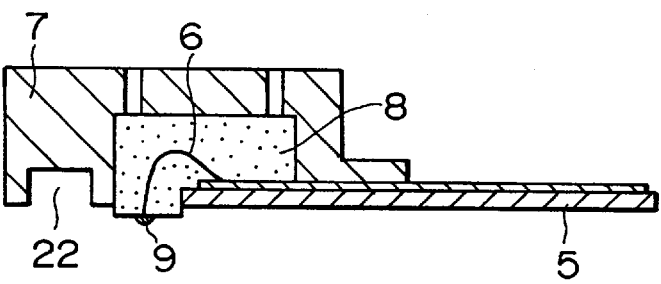

In the next place, as is illustrated in FIG. 4D, the thus exposed end portion of each of the connecting lead wires 6 is provided with a plating layer 9 of a metal with an object to improve the corrosion resistance of the end points of the connecting lead wires 6 and to ensure good contacting condition thereof with the electrode terminals of the liquid crystal display panels under inspection. The metallic material 9 for this plating is not particularly limitative provided that the above mentioned object can be accomplished including gold, silver, nickel, palladium, rhodium, tin and solder alloys as well as combinations thereof, of which gold is preferred in respect of the low contacting resistance and high corrosion resistance. The plating layer of the metal mentioned above has a thickness usually in the range from 1 to 100 $\mu$m or, preferably, from 10 to 50 $\mu$m. When the thickness of the plating layer is too small, desired good contacting condition with the electrode terminals on the display panel cannot be ensured while, when the thickness is too large, the plating layer would be subject to eventual falling or exfoliation.

Figure 4E:
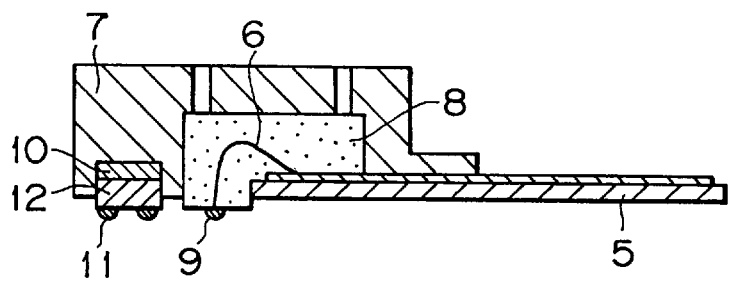

In the last step, as is illustrated in FIG. 4E, an insulating elastomer sheet 10 having a thickness of 0.1 to 2.0 mm or, preferably, 0.5 to 1.0 mm as a cushioning spacer is put into and adhesively bonded onto the bottom surface of the cavity or groove 22, which has a flat bottom surface in parallel to the circuit board 5, of the covering body 7, and a driver IC chip 12 having electrode terminals 11 is adhesively bonded to the cushioning spacer 10. It is usually important that the depth of the cavity or groove 22 is selected such that, after fixing the driver IC chip 12 to the cavity or groove 22, the electrode terminals 11 on the driver IC chip 12 and the plated end portions 9 of the connecting lead wires 6 are coplanar or, namely, on one and the same plane in order to ensure a good contacting condition between these contacting points and the electrode terminals on the liquid crystal display panel under inspection.

Figure 3:
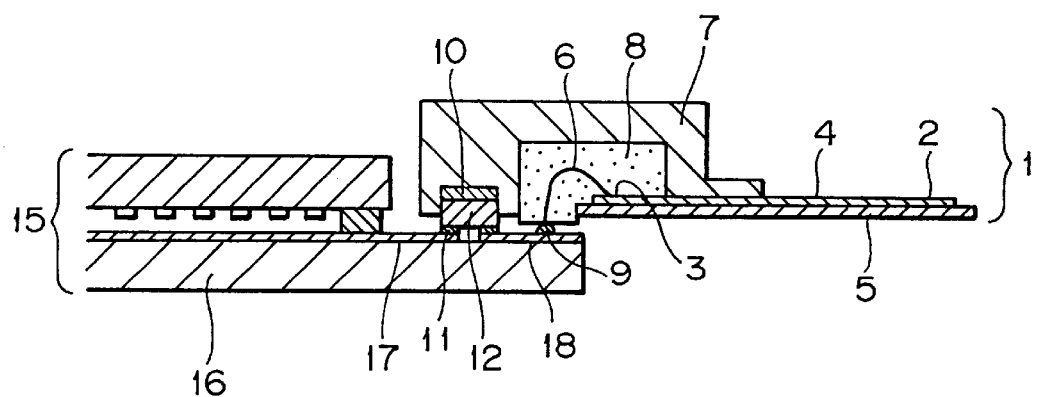
FIG. 3 is an illustration of an assembly under display inspection of a liquid crystal display panel using a connector for display inspection of the invention in COG mounting by a vertical cross sectional view.

FIG. 3 is an illustration of a testing assembly in the COG mounting using the above described connector 1 for display inspection by a vertical cross sectional view. Thus, the connector 1 for display inspection is mounted on a liquid crystal display panel 15 in such a position that the electrode terminals 11 of the driver IC chip 12 are brought into a press-contacting condition with the display output signal delivery electrodes 17 on the glass substrate 16 of the display panel 15 while the end contacting points 9 of the connecting lead wires 6 are brought into a press-contacting condition with the display input signal delivery electrodes 18 on the glass substrate 16. In this testing assembly, display inspection of the liquid crystal display panel 15 can be easily and rapidly conducted by supplying testing signals to the input electrode terminals 2 of the circuit board 5.

In the following, the present invention is described in more detail, making reference to the accompanying drawing, by way of an Example, which, however, is a preferable embodiment and never limits the scope of the invention in any way.

EXAMPLE

A connector 1 for display inspection of a liquid crystal display panel was prepared in the following manner.

A circuit board 5 having input electrode terminals 2 and output electrode terminals 3 was mounted in an exactly specified position on a thin bonding base plate 21 of copper and the bonding areas of the bonding base plate 21 was plated with gold. As is illustrated in FIG. 4A, the bonding area was selected on the flat bottom surface of a groove of small depth formed on the upper surface of the bonding base plate 21. The recessed bonding area was advantageous because the end portions of the connecting lead wires 6 could be at a level lower than the lower surface of the circuit board 5 to ensure a good contacting condition between contact points.

A plurality of connecting lead wires 6 were each bonded, at one end, to one of the output electrode terminals 3 and, at the other end, to the gold-plated bonding area on the bonding base plate 21 by using a general-purpose wire bonding machine. Thus, each of the connecting lead wires 6 was bent in an arched configuration to bridge the output electrode terminal 3 on the circuit board 5 and the bonding area on the bonding base plate 21 as is shown in FIG. 4A.

In the next place, as is illustrated in FIG. 4B, a rigid covering body 7 of a metal was mounted on and fixed to the circuit board 5 and the bonding base plate 21 in such a fashion as to bridge the circuit board 5 and the bonding base plate 21 and to envelop the arch-wise bent connecting lead wires 6 within the space formed below the covering body 7. The covering body 7 was provided in the upper wall with an injection port 23 for injection of a curable liquid resin and an air escape. A cavity 22 having a flat bottom surface was formed in the lower end surface of the downwardly extended side portion of the covering body 7. The cavity 22 had plan dimensions just to fit the driver IC chip to be subsequently inserted thereinto. Thereafter, a curable liquid resin 8 was poured into the space below the covering body 7 through the injection port 23 in the covering body 7 so that the space was completely filled with the liquid resin. The arch-wise bent connecting lead wires 6 were completely embedded as a whole in the liquid resin. The curable liquid resin was subsequently cured by heating.

In the subsequent step, as is illustrated in FIG. 4C, the bonding base plate 21 was dissolved away by dipping the assembly in an aqueous etching solution containing iron(III) chloride so as to expose the lower surface of the circuit board 5 and the end portions 9 of the connecting lead wires 6 out of the cured elastomer body 8.

Further thereafter, as is illustrated in FIG. 4D, the thus exposed end portions 9 of the connecting lead wires 6 were plated with gold. This gold-plating treatment was conducted electrolytically with the input electrode terminals 2 on the circuit board 5 to serve as the cathode in the electrolytic plating.

In the last step, as is illustrated in FIG. 4E, an insulating elastomer sheet 10 coated on both surfaces with an adhesive was put on the bottom surface of the cavity 22 in the covering body 7 and further a driver IC chip 12 having bump-formed electrode terminals 11 was inserted with exact positioning into the cavity 22 so as to be adhesively bonded to the covering body 7 with the insulating elastomer sheet 10 as a cushioning spacer intervening therebetween to complete the connector for display inspection.

What is claimed is:

1. A connector for display inspection of a liquid crystal display panel which comprises, as an assembly:

(a) a circuit board having input electrode terminals and output electrode terminals provided on one surface of the circuit board and electrically connected together;

(b) connecting lead wires each connected at one end to one of the output electrode terminals of the circuit board taking an arch-wise bent configuration, the other end being extended to a opposite side of the circuit board relative to the output electrode terminals;

(c) a rigid covering body having a downwardly extended side portion and fixed to the circuit board to cover the connecting lead wires as a whole within a space between the circuit board and the covering body, a cavity or groove being formed in a downwardly facing end surface of the downwardly extended side portion;

(d) an insulating cured elastomeric resin filling a space below the covering body to embed the connecting lead wires therein excepting end portions of the connecting lead wires not connected to the output electrode terminals to be exposed; and (e) a driver IC chip having electrode terminals in a substantially similar wiring pattern and arrangement pitch as delivery electrodes for display output signals in a glass substrate of the liquid crystal display panel to be inspected and adhesively bonded to a bottom surface of a cavity or groove formed in the downwardly facing end surface of the side portion of the covering body with intervention of an insulating elastomer sheet in such a fashion that, when the driver IC chip is brought to a position corresponding to a mounting position on the glass substrate, the exposed end portions of the connecting lead wires are on a display input signal delivery electrodes and the exposed end portions of the connecting lead wires and the electrode terminals of the driver IC chip are coplanar.

2. A method for preparation of a connector for display inspection of a liquid crystal display panel as defined in claim 1 which comprises the steps of:

(1a) forming an integral assembly of a bonding base plate and a circuit board having input electrode terminals and output electrode terminals on surface;

(1b) connecting each of the output electrode terminals of the circuit board and a bonding base plate with a connecting lead wire by wire bonding;

(2a) mounting and fixing onto the circuit board a rigid covering body having a downwardly extended side portion and provided with an injection port for injection of a liquid resin and a cavity or groove for insertion of a driver IC chip in the lower end surface of the downwardly extended side portion to bridge the circuit board and the bonding base plate in such a fashion that the connecting lead wires are enveloped in the space below the covering body;

(2b) filling the space below the covering body by injecting a curable insulating liquid elastomer resin through the injection port and curing the curable resin into an elastomer body so as to encapsulate the connecting lead wires as a whole;

(3) removing the bonding base plate from the circuit board by etching so as to expose the end portions of the connecting lead wires out of the cured elastomer body;

(4) forming a corrosion-resistant plating layer of a metal on the exposed ends of the connecting lead wires; and (5) adhesively bonding a driver IC chip onto the bottom surface of the cavity or groove in the covering body with intervention of an insulating elastomer sheet.

* * * * *